ASYNCHRONOUS TO SYNCHRONOUS PULSE CONVERTER

Filed Oct. 31, 1957 3 Sheets-Sheet 1

INVENTORS
ALBERT J. MEYERHOFF
JOHN M. WITHERSPOON
BY
J. Walter Schilpp
ATTORNEY

Nov. 21, 1961 A. J. MEYERHOFF ET AL 3,010,028

ASYNCHRONOUS TO SYNCHRONOUS PULSE CONVERTER

Filed Oct. 31, 1957 3 Sheets-Sheet 2

INVENTOR.
ALBERT J. MEYERHOFF
JOHN M. WITHERSPOON

BY J. Walter Schilpp

ATTORNEY

Nov. 21, 1961 A. J. MEYERHOFF ET AL 3,010,028

ASYNCHRONOUS TO SYNCHRONOUS PULSE CONVERTER

Filed Oct. 31, 1957 3 Sheets-Sheet 3

INVENTOR.
ALBERT J. MEYERHOFF
JOHN M. WITHERSPOON

BY

J. Walter Schilpp

ATTORNEY

United States Patent Office 3,010,028

Patented Nov. 21, 1961

3,010,028

ASYNCHRONOUS TO SYNCHRONOUS PULSE CONVERTER

Albert J. Meyerhoff, Wynnewood, and John M. Witherspoon, Havertown, Pa., assignors to Burroughs Corporation, Detroit, Mich., a corporation of Michigan Filed Oct. 31, 1957, Ser. No. 693,605

10 Claims. (Cl. 307—88)

This invention relates to pulse forming circuits and more particularly to a novel circuit utilizing solid state electronic components for converting an asynchronous input pulse to a single output pulse occurring in time coincidence with a synchronous timing pulse. The present application is a continuation-in-part of our original application Serial No. 642,475, filed February 26, 1957.

Most electronic data processing systems utilize a timing pulse generator for synchronizing the multiplicity of sequential steps which make up the processing operation. It is often required to feed a single data pulse into a synchronous system in response to the closure of a switch or relay contacts at a random time. The end instruments which sense and modify the new input information so that it is of the proper form to be fed into the processing equipment or computer usually operate at a slower speed than that of the computer. In order to signal their readiness to supply new input data to the computer, the end instruments may be adapted to actuate a relay or switch. If the relay is connected to a source of D.-C. potential the closure of the contacts will produce a signal pulse, asynchronous with respect to the timing pulse, which may be applied to the computer to initiate a new processing cycle. In order that the timing sequence of the system will not be disrupted by the introduction of this asynchronous input pulse, some circuit means must be provided to convert the random input pulse to a pulse occurring at a known time with respect to the synchronous system's timing pulse generator and in such a form that the system can make use of the pulse. Prior art devices have accomplished this pulse conversion by utilizing combinations of vacuum tube flip-flops and diode gates.

This invention relates to a particular circuit configuration utilizing solid state electronic devices, namely, transistors and magnetic cores possessing rectangular hysteresis loop properties for accomplishing the pulse conversion with considerable saving in the number of components and the complexity of the device. Further advantages inherent in the solid state components themselves include saving in space, efficiency, dependability, and longevity. Another feature of the instant invention is that noise pulses which occur along with the input pulse due to bounce of the relay contacts do not affect the output pulse delivered to the processing system. The problems of synchronization concomitant with the occurrence of simultaneous or overlapping data and timing pulses are solved by the instant circuit without the possibility of error or ambiguity.

Accordingly, it is an object of the instant invention to provide improved circuits utilizing solid state components in connection with electronic data processing systems.

A more specific object of this invention is to provide the means whereby information occurring at a random time may be delivered to a synchronous system.

A further object of this invention is to provide an asynchronous to synchronous one-shot pulse converter capable of furnishing an unambiguous synchronized output regardless of the relative occurrences of the random and timing pulses. Other features and objects of the invention will be described throughout the following detailed description of the invention and illustrated in the accompanying drawings in which.

Figure 1:
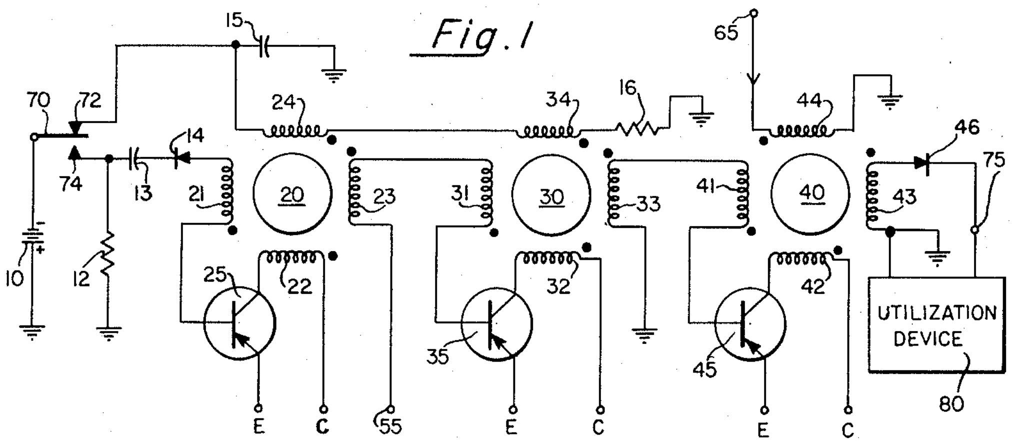
FIG. 1 is a schematic diagram illustrating an embodiment of the instant invention.

Before proceeding with a detailed analysis of the circuit it will be helpful to review the notation used in connection with the schematic diagram. As hereinbefore mentioned, the instant invention makes use of magnetic cores having rectangular hysteresis loop characteristics. Cores having these properties are capable of being rapidly switched from one of two possible conditions of magnetization to the other by a magnetizing force exerted by associated electrical windings. These cores additionally are capable of remaining in their last assumed magnetic condition after the force which caused the condition has subsided. Information of opposite polarities to be stored in the binary elements is arbitrarily designated in the binary notation "1" and "0." Magnetic binary elements are shown as circles and it is assumed that these circles represent magnetic cores having essentially rectangular hysteresis loop characteristics. Although the magnetic elements are depicted herein as being toroidal in form, it is understood that the invention is not limited to elements of this particular geometry, but may include other forms of magnetic storage elements. Each of the magnetic cores is supplied with windings for producing a magnetic flux therein in response to current flow through these windings. A dot is placed at the end of each of these windings to indicate that that end has a negative polarity during read-in of a binary "1" and a positive polarity during read-out of a binary "1." Thus, as current flows into the dotted winding terminal the core associated with such winding will tend to store a "0." Conversely, if the current flows into an undotted winding terminal the core associated with such winding will tend to store a "1." The transistor elements depicted in the embodiment of FIG. 1 are junction PNP type. The instant invention is not restricted to the use of this type of transistor but may employ other types in accordance with established design procedures well known to those skilled in the art.

In consideration of FIG. 1 there are shown three binary magnetic storage elements 20, 30 and 40, each of which is associated with transistors 25, 35 and 45, respectively. Coupled to magnetic element 20 are trigger winding 21 which terminates at the base of transistor 25, a switching winding 22 connected in series in the collector circuit of transistor 25, a transfer winding 23 and a reset winding 24. Likewise magnetic element 30 has coupled to it a trigger winding 31 which terminates at the base of transistor 35, a switching winding 32 connected in series in the collector circuit of transistor 35, a transfer winding 33 and a reset winding 34. A single pole, two-position switch comprising contacts 72 and 74 and a switch arm 70, which is connected to a source of D.-C. potential 10, is adapted to produce current flow through reset windings 24 and 34 when switch arm 70 touches contact 72 and to generate an asynchronous voltage pulse when switch arm 70 is moved to contact 74. Resistor 16 is connected in series with windings 24 and 34 to limit the flow of current in the reset circuit drawn from source 10; and resistor 12 provides substantially the same D.-C. load for source 10 during the generation of an asynchronous input pulse. Capacitor 13, in combination with the input impedance of transistor 25, serve to differentiate the input pulse. Diode 14 is of the proper polarity to pass the negative trigger voltage derived from the leading edge of the asynchronous input pulse and to suppress the positive pulse occurring at the trailing edge of the input pulse. The negative trigger voltage is applied through winding 21 to transistor 25 and the regenerative switching of magnetic element 20 is initiated. The switching voltage developed across winding 23 is coupled to the base of transistor 35 via trigger winding 31 of a second magnetic element 30 and serves to initiate the regenerative switching of element 30. The switching voltage developed across winding 33 is coupled to the base of transistor 45 via trigger winding 41 of a third magnetic element 40 and serves to initiate the regenerative switching of element 40. Also coupled to magnetic element 40 are a switching winding 42 connected in series with the collector electrode of transistor 45, an output winding 43 for delivering a synchronous pulse via diode 46 to a utilization device 80 and an interrogation winding 44 adapted to be pulsed by current derived from synchronous timing pulses. Thus the random closure of switch 70 results in a succession of pulses within the converter, the output of the first transistor-magnetic core stage triggering the second transistor-core stage which in turn triggers the succeeding transistor-core stage. Under certain conditions the triggering of transistor 35 by the output voltage developed across winding 23 during the change of magnetic remanent state of element 20 is delayed by an inhibit pulse applied to terminal 55 for reasons which will become apparent in the circuit operation hereinafter described in detail. Capacitor 15 serves to reduce the noise voltages appearing in the reset circuit due to contact bounce when the switch arm is moved to contact 72. The collectors of the transistors are returned by their respective switching windings to the negative terminal of a bias voltage source C. The emitter electrodes of the transistors are connected to the negative terminal of another bias voltage source E which tends to keep the transistors cut-off and thereby establishes a signal threshold level below which noise pulses cannot trigger the transistor-magnetic core stages.

Figure 2:
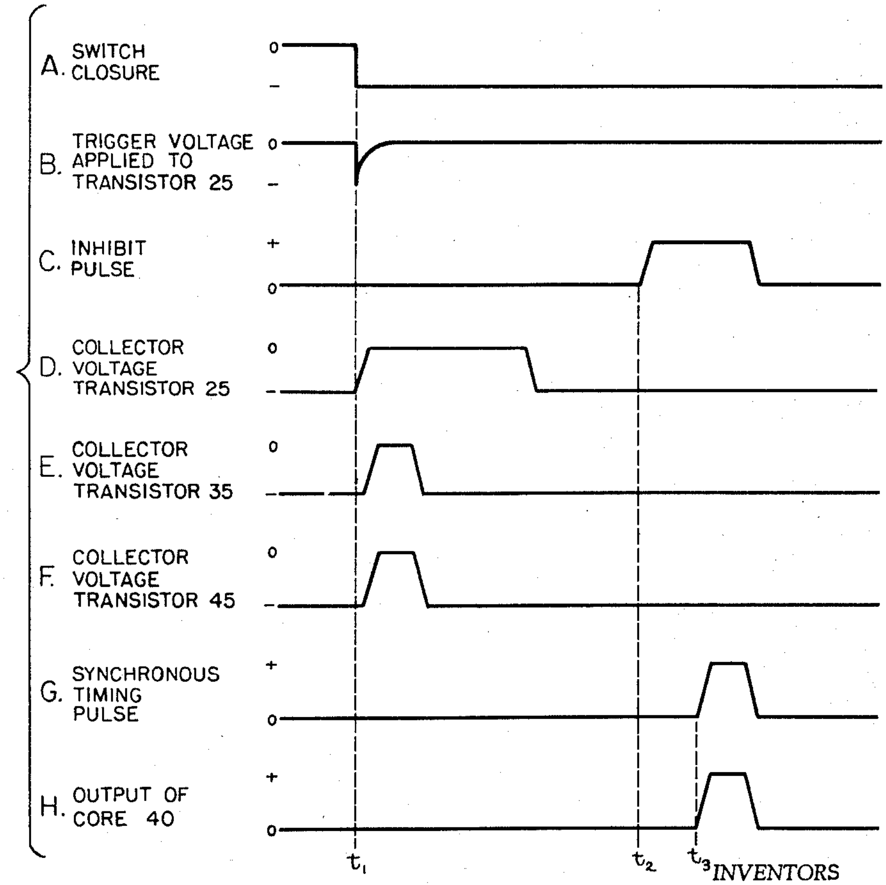
FIG. 2 (A through H) is a diagrammatic representation of the time relationships of pulses in the converter circuit for a random input pulse.

Referring now to FIG. 1 in conjunction with the wave form diagram of FIG. 2, assume that the switch-arm 70 is touching contact 72. Current flows in the circuit comprising resistor 16, windings 34 and 24, contact 72, switch arm 70, and source 10, in such a direction as to reset magnetic cores 20 and 30 to their respective "0" remanent states. If switch arm 70 is moved to contact 74 at any random time $t_1$, the voltage at that contact will drop from ground level to the negative potential of source 10, as illustrated in FIG. 2A. Capacitor 13 in combination with the base input impedance of transistor 25 differentiates this negative-going pulse resulting from the switch closure and applies a negative trigger pulse to the base of transistor 25 via blocking diode 14 and trigger winding 21. Said trigger pulse is illustrated in FIG. 2B. The emitter electrode of transistor 25 is biased negatively with respect to the base by a suitable low power D.-C. source E in order to keep the transistor cut off until a threshold above noise level is reached. When the trigger pulse of FIG. 2B is applied to the base of transistor 25 the threshold level is overcome and current flows from source E through the emitter, base and collector electrodes respectively of transistor 25 into the undotted terminal of winding 22, through the collector supply source C and thence back to bias source E. The voltage on the collector electrode of transistor 25 approaches ground potential, or more accurately the collector saturation potential, which is slightly negative. The voltage potential developed across winding 22 is the resultant of the collector supply potential and the collector saturation voltage. As magnetic core 20 begins to switch towards its "1" magnetic remanent state, a voltage is developed across windings 21, 23 and 24 of such polarity that the dotted terminals of each of these windings is negative with respect to its undotted terminal. Since the dotted terminal of winding 21 is connected to the base of transistor 25 the negative potential appearing thereon is equivalent to the trigger voltage which initiated the switching cycle, and current continues to flow via the transistor circuit through switching winding 22. Thus the voltage induced across winding 21 keeps the collector electrode of transistor 25 at saturation potential and the regenerative switching continues until core 20 has completely switched to its "1" remanent state. When core 20 has reached this remanent state, the switching voltage induced across winding 21 terminates and the base electrode of transistor 25 is no longer negative with respect to the emitter. The transistor ceases to conduct and the collector voltage returns to C, the collector supply potential.

As hereinbefore mentioned, voltages are also induced in windings 24 and 23, while magnetic core 20 is switching from its preset "0" remanent state to the "1" state. The voltage developed across winding 24 does not serve any useful function insofar as the circuit operation is concerned, and will be neglected in the instant description. On the other hand, the voltage pulse appearing across transfer winding 23 as a result of the switching of magnetic core 20 is applied to the base of transistor 35 via trigger winding 31 of magnetic core 30. The duration of such transfer pulse appearing across winding 23, and indicated in FIG. 2D, is a function of the collector supply voltage C and the collector saturation voltage of transistor 25, the number of turns of winding 23 and the magnetic flux of core 20. The preferred width of this transfer pulse will hereinafter be considered. The emitter electrode of transistor 35 is likewise biased negatively with respect to the base by source E which prevents small noise voltages from triggering the transistor to conduction. The negative potential appearing on the base of transistor 35 as a result of a voltage induced across winding 23 is sufficient to overcome said bias level and current flows from source E through the emitter, base and collector electrodes, respectively, of transistor 35 into the undotted terminal of switching winding 32 and thence back to source E through the internal impedance of collector supply source C. As magnetic element 30 switches toward the "1" state a voltage is induced across winding 31 which tends to keep the transistor in a conducting state until core 30 has completely switched to the "1" state. The regenerative switching of magnetic element 30 is the same as that described in connection with magnetic element 20. The voltage on the collector electrode of transistor 35 is shown in FIG. 2E. The inhibit pulse depicted in FIG. 2C and applied unconditionally to terminal 55 at time $t_2$ has no effect on the circuit operation thus far described but will be considered in detail in connection with the waveform diagrams of FIGS. 3 and 4, where its function will become apparent. As magnetic element 30 switches toward the "1" state, voltages are induced in windings 34 and 33 coupled thereto. The voltage developed across winding 34 will be neglected in the instant description. However, the voltage pulse appearing across transfer winding 33, as a result of the switching of magnetic core 30, is applied to the base of transistor 45 via trigger winding 41 of magnetic core 40. Transistor 45 is triggered to conduction and magnetic element 40 is regeneratively switched from its "0" magnetic remanent state to its "1" remanent state in the same manner as that hereinbefore described in connection with magnetic cores 20 and 30. The voltage on the collector electrode of transistor 45 is depicted in FIG. 2F. As magnetic element 40 switches toward the "1" state a voltage is induced across output winding 43 coupled thereto. Diode 46 prevents current from flowing in the output circuit because of the voltage induced across output winding 43 during the switching of magnetic element 40 to the "1" state. Subsequently at time $t_3$ a synchronous timing pulse as shown in FIG. 2G is applied through terminal 65 to interrogation winding 44. Current flows into the dotted terminal of winding 44 and switches magnetic element 40 towards its "0" remanent state. The voltage pulse induced across output winding 43 during the switching of core 40 is coupled via diode 46 and terminal 75 to a utilization device 80. The switching output of magnetic core 40 is depicted in FIG. 2H. Thus the original random pulse applied to the converter circuit has been synchronized with a timing pulse.

The circuit operation described thus far assumed that the random pulse applied to the converter circuit did not occur during the time interval comprising the period of the timing pulse or the time immediately prior to its occurrence. The occurrence of the random pulse during these periods would result in the interrogation of magnetic core 40 during the same time that the core was being regeneratively switched to the "1" state. Thus core 40 might be partially read out by the interrogation pulse, thereby producing an output pulse of insufficient amplitude to actuate the utilization device or, in some cases, no output at all. This erratic operation would result in unpredictable errors in the system output. The inhibit pulse applied to terminal 55 overcomes this difficulty. Referring again to FIG. 1 in combination with the waveform diagrams of FIG. 3 consider the circuit operation when the switch closure occurs at a time immediately preceding the timing pulse.

FIG. 3A shows synchronous timing pulses at times $t'_2$ and $t'_4$. The dotted pulse shown in the figure between times $t'_1$ and $t'_2$ represents a period of time equal in duration to the width of a timing pulse and occurring immediately prior thereto. The switch closure shown in FIG. 3B occurs at $t'_1$ and a trigger pulse shown in FIG. 3C is simultaneously applied to the base of transistor 25. FIG. 3D depicts the collector voltage of transistor 25 during the switching of magnetic element 20. As hereinbefore explained, as soon as the switching action is initiated in magnetic core 20, a trigger voltage is applied to the base of transistor 35 to initiate a switching of core 30. However the application to terminal 55 of a positive voltage pulse of slightly greater amplitude than the negative potential developed across winding 23 during the switching of core 20, will bias the base of transistor 35 positively with respect to the emitter and the transistor will not conduct so long as the inhibit pulse is present. While transistor 35 is being held cut-off by the inhibit pulse, magnetic element 30 remains in its "0" magnetic remanent state. Likewise magnetic element 40 remains in its "0" magnetic remanent state. Therefore the timing pulse applied to interrogation winding 44 at time $t'_2$ does nothing more than drive core 40 from its "0" remanent state into "0" saturation and the only output developed across winding 43 is an insignificant noise voltage. In actual practice, the inhibit pulse depicted in FIG. 3E is conveniently derived from the synchronous system's timing pulse generator and may have a pulse width equivalent to two adjacent timing pulses. At the termination of the inhibit pulse at time $t'_3$ magnetic core 20 is still switching toward its "1" state and the voltage developed across output winding 23 will then trigger transistor 35 to conduction. The switching of magnetic core 30 results in the triggering of transistor 45 and the subsequent operation of the converter circuit is identical to that hereinbefore described in connection with FIGS. 1 and 2. Since it is necessary that core 20 be still switching toward the "1" state when the inhibit pulse terminates, the switching time required to completely switch core 20 from its "0" state to the "1" state must be taken into consideration when the stage is designed. A suitable time for core 20 has been found to be approximately three times the duration of a timing pulse. FIG. 3F depicts the collector voltage of transistor 35 during the switching of magnetic core 30; FIG. 3G shows the collector voltage of transistor 45 during the switching of magnetic core 40. The switching time for magnetic core 30 should be less than the minimum pulse width of a timing pulse; the switching time for magnetic core 40 is preferably less than the maximum pulse width of a timing pulse. At time $t'_4$ the synchronous timing pulse applied to winding 44 of output core 40 results in the development of a switching voltage across winding 43 as indicated in FIG. 3H, said output being fed to the utilization device 80 via diode 46 and terminal 75.

Figure 3:
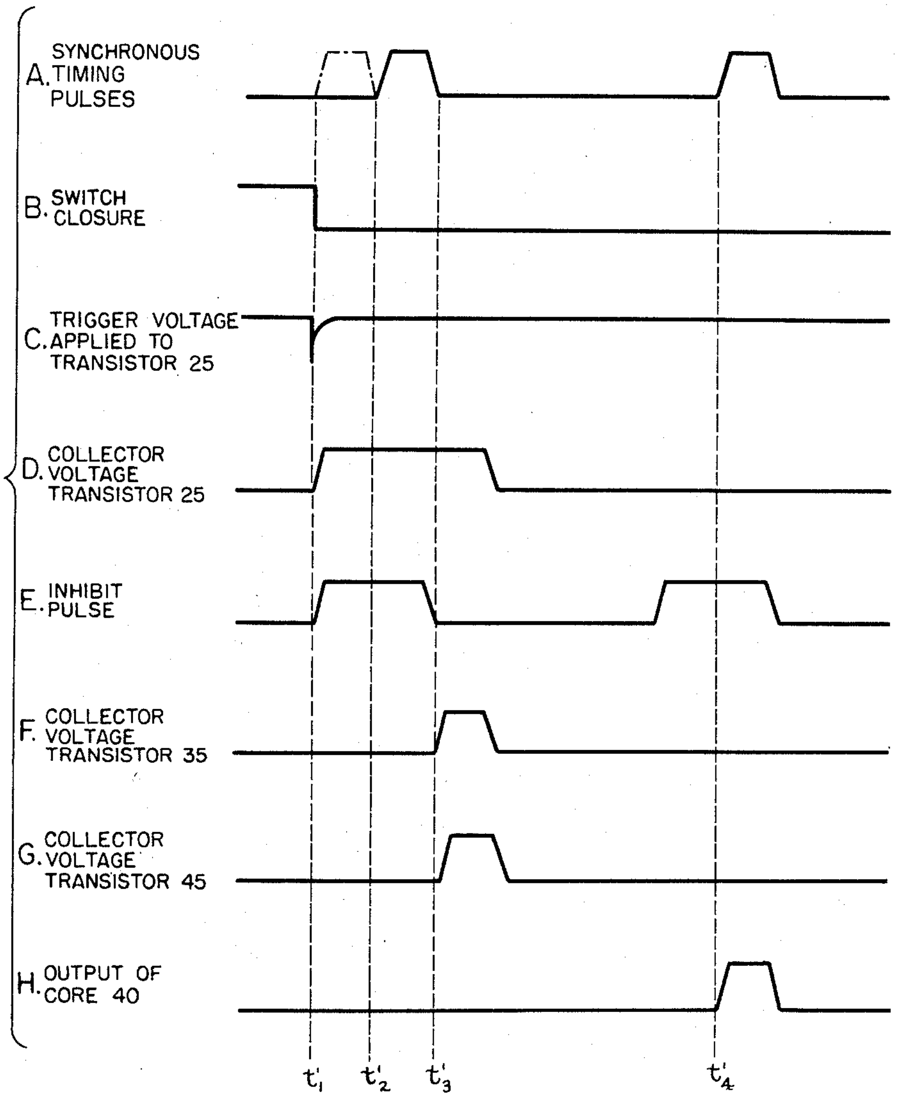
FIGS. 3 and 4 (A through H, respectively) are diagrammatic representations of the time relationships of pulses in the converter circuit for different random occurrences of an input pulse.
Figure 4:
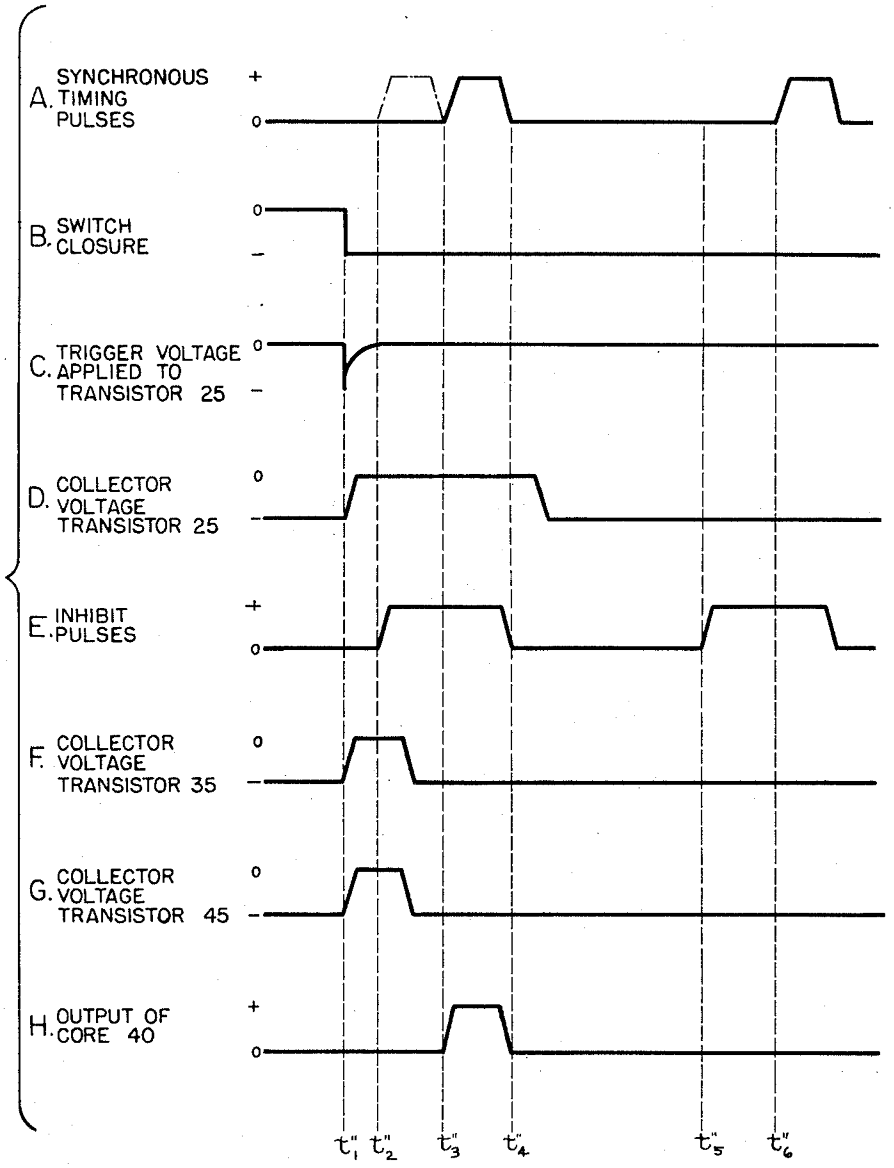

In the operation of the instant invention hereinbefore described in connection with FIGS. 2 and 3, for certain occurrences of random pulses relative to a train of synchronous timing pulses, the need for the final transistor-core stage which switches in response to, and simultaneously with, the preceding transistor-core stage is not apparent. FIG. 4 illustrates a particular case in which the random and synchronous pulses occur at such times that the final stage is essential to prevent ambiguous outputs from the converter circuit.

FIG. 4A shows synchronous timing pulses at times $t''_3$ to $t''_6$. The switch-closure shown in FIG. 4B occurs at time $t''_1$ and a trigger pulse shown in FIG. 4C is simultaneously applied to the base of transistor 25. FIG. 4D depicts the collector voltage of transistor 25 during the switching of magnetic element 20. As hereinbefore explained, in the absence of an inhibit pulse applied to terminal 55, magnetic element 30 switches in response to the switching of magnetic element 20. The collector voltage of transistor 35, during the switching of magnetic element 30, is depicted in FIG. 4F. Likewise magnetic element 40 switches in response to the switching of element 30 as indicated by FIG. 4G. At time $t''_2$ an inhibit pulse is applied to terminal 55. It should be noted that this positive inhibit pulse is large enough to prevent the initiation of switching in magnetic element 30 by opposing the negative potential developed across winding 23 during the switching of core 20, but is of insufficient amplitude to stop the switching of core 30 once the regenerative effect of the switching voltage developed across winding 31 is present. At time $t''_3$ a synchronous timing pulse is applied through terminal 65 to interrogation winding 44 of output core 40 and an output voltage pulse illustrated in FIG. 4H is fed to the utilization device 80. At time $t''_4$ the inhibit pulse terminates, and since magnetic element 20 is still switching from its "0" magnetic remanent state to its "1" state, the voltage induced across winding 23 biases transistor 35 to conduction. However, since magnetic element 30 had previously been switched to the "1" state, the current flowing through switching winding 32 does nothing more than to drive element 30 from its "1" remanent state toward "1" saturation and the small noise voltage developed across winding 33 is insufficient to trigger transistor 45 to conduction. Accordingly, output core 40 having been read out or interrogated at time $t''_3$ produces no output pulse to the utilization device when it is interrogated by a subsequent timing pulse at time $t''_6$.

A review of the timing sequences illustrated in FIG. 4 reveals the difficulty encountered if the final stage of the converter is removed. Assume that the output transistor-magnetic core stage, comprising transistor 45 and core 40, are eliminated and that the second stage, comprising transistor 35 and core 30, is adapted to be interrogated by synchronous timing pulses and to deliver a synchronous output pulse to the utilization device for each random input pulse. In accordance with the mode of operation previously described in connection with FIG. 4, core 30 would be switched at time $t''_3$ from its "1" magnetic remanent state to its "0" state commencing with the application of a synchronous timing pulse to an interrogation winding coupled to core 30. At the termination of the inhibit pulse at time $t''_4$, the voltage induced in winding 23 during the switching of magnetic element 20 triggers transistor 35 to conduction and core 30 is again regeneratively switched from its "0" remanent state to its "1" state. At time $t''_6$ another synchronous timing pulse applied to said interrogation winding on core 30 switches the core and a second output pulse is delivered to the utilization device. Thus the elimination of the final output stage results in an undesirable situation in which two synchronous outputs are produced in response to a single random input.

It should be observed that the converter circuit of the instant invention is limited with regard to the relative frequencies of the random and timing pulses applied to it. The period between random pulses must necessarily be greater than the period between timing pulses. Consider the case where two random pulses occur in the interval between two timing pulses. The second of the random pulses would be lost since output core 40 having been "set" by the first random pulse must be interrogated by a timing pulse before it can accept new information.

From the foregoing description of the invention, it is evident that the present technique of employing solid-state electronic components in an asynchronous to synchronous pulse converter results in efficient, dependable, noise-free operation. It must be understood that while a preferred embodiment of the present invention has been shown, this embodiment is meant to be illustrative only and is not limitative of the invention. Many modifications will be suggested to those skilled in the art, and all such variations as are in accord with the principles discussed previously are meant to fall within the scope of the appended claims.

What is claimed is:

1. Apparatus for synchronizing first and second electrical signals comprising first, second and third bistable magnetic storage components each having two stable states of magnetic remanence; means for applying said first electrical signal to said first magnetic component, means responsive to the application of said first electrical signal to said first magnetic component for switching said first magnetic component from a preselected stable state to its other stable state; means responsive to said switching of said first magnetic component for switching said second magnetic component from a preselected stable state to its other stable state; means responsive to said switching of said second magnetic component for switching said third magnetic component from a preselected stable state to its other stable state; means for applying said second electrical signal to said third magnetic component for restoring said third component to its original preselected stable state; means actuated by the switching of said third magnetic component to its original stable state for generating an output synchronized signal; means operative during the switching of said first magnetic component for inhibiting the switching of said second magnetic component during a time interval commencing prior to the occurrence of said second electrical signal and ending with the termination of said latter signal; said time interval having a minimum duration equal to the sum of the times consumed in switching said second magnetic component from a preselected stable state to its other stable state and in applying said second electrical signal to said third magnetic component, and having a maximum duration less than the time consumed in switching said first magnetic element from a preselected stable state to its other stable state.

2. Apparatus for synchronously relating first and second electrical signals comprising, in combination, first, second and third bistable magnetic storage elements each having two stable states of magnetic remanence; a trigger winding and a switching winding disposed on each of said magnetic elements; an amplifier device connected in common to said trigger and switching windings associated with each of said magnetic elements and forming therewith a regeneratively coupled circuit; means for applying said first electrical signal to the trigger winding on said first magnetic element for switching said first element from a preselected stable state to its other stable state; means coupling said first and second magnetic elements for switching said second magnetic element from a preselected stable state to its other stable state in response to said switching of said first magnetic element; means coupling said second and third magnetic elements for switching said third magnetic element from a preselected stable state to its other stable state in response to said switching of said second magnetic element; means for inhibiting the switching of said second magnetic element during a time interval commencing prior to the occurrence of said second electrical signal and ending with the termination of said latter signal; said time interval having a minimum duration equal to the sum of the time consumed in switching said second magnetic element from a preselected stable state to its other stable state and the pulse time of said second electrical signal, and having a maximum duration less than the time consumed in switching said first magnetic element from a preselected stable state to its other stable state; an interrogation winding and an output winding disposed on said third magnetic element; means for applying said second electrical signal to said interrogation winding for restoring said third magnetic element to its original preselected stable state, thereby inducing in said output winding a signal pulse coincident with said second electrical signal.

3. Apparatus as in claim 2 wherein fixed bias means are coupled with the amplifier device associated with each of the magnetic elements to prevent the triggering of said device by noise voltages falling below a threshold level.

4. Apparatus as defined in claim 2 wherein said amplifier device is a transistor.

5. Apparatus as defined in claim 2 wherein the switching winding is coupled to the transistor collector electrode, and the trigger winding is coupled to the transistor base electrode, said switching and trigger windings being coupled to the transistor electrodes in such a manner that the electrical polarities of said windings are opposite.

6. An asynchronous to synchronous pulse converter comprising, in combination, first second and third bistable magnetic storage elements each having two stable states of magnetic remanence; a trigger winding and a switching winding respectively coupled to each of said magnetic elements; an amplifier device connected in common to said trigger and switching windings coupled to each of said magnetic elements and forming therewith a regeneratively coupled circuit; a reset winding coupled to each of said first and second magnetic elements; a single pole two position switch adapted, in a first position, to energize a series circuit comprising the reset winding on each of said first and second magnetic elements for establishing a preselected stable flux state therein and, in a second position, to generate an asynchronous pulse; means for differentiating said asynchronous pulse; rectifier means for applying a differentiated pulse of predetermined polarity to the trigger winding on said first magnetic element for switching said first element from a preselected stable state to its other stable state; means coupling said first and second magnetic elements for switching said second magnetic element from a preselected stable state to its other stable state in response to said switching of said first magnetic element; means coupling said second and third magnetic elements for switching said third magnetic element from a preselected stable state to its other stable state in response to said switching of said second magnetic element; means for inhibiting the switching of said second magnetic element during a time interval commencing prior to the occurrence of said synchronous pulse and ending with the termination of said latter pulse, said time interval having a minimum duration equal to the sum of the time required to switch said second magnetic component from a preselected stable state to its other stable state and the time duration of said synchronous pulse, and having a maximum duration less than the time required to switch said first magnetic element from a preselected stable state to its other stable state; an interrogating winding and an output winding disposed on said third magnetic element; means for applying said synchronous pulse to said interrogation winding for restoring said third magnetic element to its original stable state thereby inducing in said output winding a signal pulse coincident with said synchronous pulse; and means for coupling said signal pulse to a utilization device.

7. A combination as defined in claim 6 wherein a capacitor is connected to said switch in order to prevent the spurious triggering of the amplifier devices due to noise voltages generated when said first switch position is established.

8. An electronic circuit for generating an output synchronous signal pulse in time coincidence with the occurrence of a pulse in a train of synchronous timing pulses for each pulse in a first applied train of data pulses comprising, in combination, a first, second and third bistable magnetic core each having two stable states of magnetic remanence; a trigger winding and a switching winding disposed on each of said magnetic cores; a transistor connected in common to said trigger and switching windings associated with each of said magnetic cores and forming therewith a regeneratively coupled circuit; means for applying each of said data pulses to the trigger winding on said first magnetic core for switching said first core from a preset stable residual flux condition to its other flux condition; means coupling said first and second magnetic cores for switching said second magnetic core from a preset stable residual flux condition to its other stable flux condition in response to said switching of said first magnetic core; means coupling said second and third magnetic cores for switching said third magnetic core from a preset stable residual flux condition to its other stable flux condition in response to said switching of said second magnetic core; means for inhibiting the switching of said second magnetic core during a time interval commencing prior to the occurrence of each of said timing pulses and ending with the termination of each of said latter pulses; said time interval having a minimum duration equal to the sum of the time consumed in switching said second magnetic core from a preset stable flux condition to its other stable flux condition and the time duration of each of said timing pulses, and having a maximum duration less than the time consumed in switching said first magnetic element from a preset stable flux condition to its other stable flux condition; an interrogation winding and an output winding disposed on said third magnetic core; means for applying each of said timing pulses to said interrogation winding for reversing the flux condition in said third magnetic core, thereby inducing in said output winding a synchronized signal pulse coincident with one of said timing pulses.

9. Apparatus for converting an asynchronous electrical pulse to an output signal pulse occurring simultaneously with a synchronous electrical pulse comprising a first bistable magnetic memory element having two stable states of magnetic remanence; a first transistor associated with said first magnetic element; bias means normally cutting-off said first transistor; a first trigger winding disposed on said first magnetic element and coupled to an input electrode of said first transistor; means for applying an asynchronous electrical pulse to said input electrode of said first transistor for overcoming the cut-off bias and initiating conduction therein; a first switching winding coupled to a further electrode of said first transistor so as to create a sustaining flux linkage between said first switching winding and said first trigger winding during the switching of said first magnetic element from a preselected stable state to its other stable state; a first output winding coupled to said first magnetic element; a second bistable magnetic memory element having two stable states of magnetic remanence; a second transistor associated with said second magnetic element; bias means normally cutting-off said second transistor; a second trigger winding disposed on said second magnetic element and coupled to an input electrode of said second transistor; means for applying the switching potential generated across the said first output winding on said first magnetic element to said input electrode of said second transistor for overcoming the cut-off bias and initiating conduction therein; a second switching winding coupled to a further electrode of said second transistor so as to create a sustaining flux linkage between said second switching winding and said second trigger winding during the switching of said second magnetic element from a preselected stable state to its other stable state; a second output winding coupled to said second magnetic element; a third bistable magnetic memory element having two stable states of magnetic remanence; a third transistor associated with said third magnetic element; bias means normally cutting-off said third transistor; a third trigger winding disposed on said third magnetic element and coupled to an input electrode of said third transistor; means for applying the switching potential generated across said second output winding on said second magnetic element to said input electrode of said third transistor for overcoming the cut-off bias and initiating conduction therein; a third switching winding coupled to a further electrode of said third transistor so as to create a sustaining flux linkage between said third switching winding and said third trigger winding during the switching of said third magnetic element from a preselected stable state to its other stable state; means for inhibiting the switching of said second magnetic element for a time interval commencing prior to the occurrence of said synchronous electrical pulse and ending with the termination of said latter pulse; said time interval having a minimum duration equal to the sum of the time required to switch said second magnetic element from a preselected stable state to its other stable state and the time duration of said synchronous electrical pulse, and having a maximum duration less than the time required to switch said first magnetic element from a preselected stable state to its other stable state; an interrogation winding and a third output winding disposed on said third magnetic element; means for applying said synchronous electrical pulse to said interrogation winding for restoring said third magnetic element to its original preselected stable state, thereby generating in said third output winding an output signal pulse coincident with said synchronous electrical pulse; and means coupling said output signal pulse to a utilization device.

10. Apparatus as in claim 9 wherein said means for inhibiting the switching of said second magnetic element comprises a source of voltage potential adapted to be applied periodically to an electrode of said second transistor to keep said second transistor cut-off in the present of the switching potential developed across said first output winding associated with said first magnetic element and applied to an input electrode of said second transistor for establishing conduction therein.

References Cited in the file of this patent

UNITED STATES PATENTS

| | | |
|---|---|---|
| 2,742,632 | Whitely | Apr. 17, 1956 |
| 2,747,110 | Jones | May 22, 1956 |
| 2,758,787 | Felker | Aug. 14, 1956 |
| 2,900,508 | Tillman | Aug. 18, 1959 |
| 2,911,626 | Jones et al. | Nov. 3, 1959 |